United States Patent [19]

Hopkins

[11] Patent Number: 5,614,902
[45] Date of Patent: Mar. 25, 1997

[54] RATIOMETRIC ANALOG TO DIGITAL CONVERTER WITH AUTOMATIC OFFSET

[75] Inventor: Thomas L. Hopkins, Mundelein, Ill.

[73] Assignee: SGS-Thomson Microelectronics, Inc., Carrollton, Tex.

[21] Appl. No.: 346,903

[22] Filed: Nov. 30, 1994

[51] Int. Cl.⁶ ...................................................... H03M 1/66
[52] U.S. Cl. ............................ 341/118; 341/119; 341/120; 341/167; 341/168
[58] Field of Search ..................................... 341/118, 119, 341/120, 161, 162, 163, 128, 166, 167, 168

[56] References Cited

U.S. PATENT DOCUMENTS

| | | | |
|---|---|---|---|
| 3,747,089 | 7/1973 | Sharples | 340/347 |
| 3,930,252 | 12/1975 | Storar | 340/347 |
| 4,118,698 | 10/1978 | Becker | 340/347 |
| 4,195,283 | 3/1980 | Ishikawa | 340/347 |
| 4,229,730 | 10/1980 | Huntington | 340/347 |
| 4,243,975 | 1/1981 | Masuda et al. | 340/347 |
| 4,357,600 | 11/1982 | Ressmeyer et al. | 340/347 |
| 4,395,701 | 7/1983 | Evans | 340/347 |
| 4,484,177 | 11/1984 | Jobbagy | 340/347 |
| 4,568,913 | 2/1986 | Evans | 340/347 |
| 4,989,005 | 1/1991 | Wakiyama et al. | 341/166 |

FOREIGN PATENT DOCUMENTS

| | | | |
|---|---|---|---|
| 0212824 | 12/1982 | Japan | 341/128 |

OTHER PUBLICATIONS

Analog–Digital Conversion Handbook, by Engineering Staff of Analog Devices Inc., Prentice–Hall 1986, pp. 188–189.

*Primary Examiner*—Jeffrey A. Gaffin
*Assistant Examiner*—Jason H. Vick
*Attorney, Agent, or Firm*—Theodore E. Galanthay; Lisa K. Jorgenson; Renee M. Larson

[57] ABSTRACT

According to the present invention, standard analog to digital converter circuitry may be utilized to measure an unknown analog value and to produce a digital value after conversion that automatically contains an offset value with respect to a given measurement range. The digital value produced according to the present invention is not representative of a raw measurement value but rather is representative of a value with respect to a given measurement range; thus, a digital value of 0 may indicate the minimum value of a given measurement range rather than a value of 0 Ohms, 0 volts, or 0 Amps. This may be expressed in equation form where the desired conversion value is represented by:

$$k(X_{unknown} - X_{offset})$$

where k is a constant, $X_{unknown}$ is the unknown analog value being measured, and $X_{offset}$ is the offset value. $X_{offset}$ the offset value may or may not be equal to a reference value. The automatic offset function of a standard A/D converter is accomplished by the inclusion of an additional fixed time during the measurement period.

22 Claims, 4 Drawing Sheets

RATIOMETRIC ANALOG TO DIGITAL CONVERTER WITH AUTOMATIC OFFSET

REFERENCE TO RELATED APPLICATIONS

The subject matter of the present application is related to copending United States application, titled "Successive Approximation Analog to Digital Converter with Automatic Offset", filed Nov. 30, 1996, Ser. No. 08/346,779, which is assigned to the assignee hereof and is herein incorporated by reference.

BACKGROUND OF THE INVENTION

The present invention relates generally to measurement technology, and more specifically to measurement accomplished by ratiometric analog to digital converter technology.

There exists a great number and variety of applications where it is desired to measure a value, such as resistance, voltage, or current, with a fixed resolution. Analog to digital converters (A/D converters) are often used to measure an actual value, analog in form, and then to convert this measurement to a digital value. Digital voltmeters (DVMs), for instance, employ an A/D converter such as a dual-slope or ratiometric A/D converter in order to generate a very precise digital readout of a dc voltage applied to its input; the use of a standard dual-slope A/D converter provides the advantage of requiring only a minimal amount of calibration of the DVM. In addition to the standard dual-slope A/D converter shown in FIG. 1, other examples of integrating-type A/D converters include a single slope A/D converter, a dual-slope A/D converter having matched dual integrators, and a dual-slope A/D converter having sample-and-hold circuitry.

As mentioned above, a standard dual-slope A/D converter may be used to measure an unknown analog value, such as resistance, voltage, or current, and convert the measured analog value to a digital value. Typically, when measuring an analog value offset from a common ground reference, the unknown analog value is measured with a resolution that is higher than the required resolution and then an offset value is subtracted from the unknown analog value and the result rounded off to the desired resolution. Suppose that 8 bits of resolution is desired. The measurement must be made with a higher resolution than 8 bits, such as 9 bits or 10 bits of resolution, and the measurement result, after subtraction of an offset value from the unknown analog value, must be rounded off to 8 bits of resolution. For instance, if a value between 2 volts and 4 volts is to be measured with 8 bits of accuracy equal to $2^8$ or 256 bits, then 9 bits of resolution, $2^9$ or 512 bits, must be used to make the actual measurement. Furthermore, if a value between 4 volts and 6 volts is to be measured with 8 bits of accuracy, then 10 bits of resolution equal to $2^{10}$ or 1024 bits must be used to make the actual measurement. After the measurement has been made with a higher degree of resolution than the desired resolution and after subtraction of an offset value from the unknown analog value, then the result is rounded off to the desired resolution, in this case 8 bits resolution.

This type of conversion requires an A/D converter, such as a standard dual-slope A/C converter, with a resolution and accuracy higher than the required resolution and some logic to perform the subtraction. A schematic diagram of a standard dual-slope A/D converter 10 which may be used is shown in FIG. 1. Dual-slope A/D converter 10 is comprised of a first current source 12 having a current I1, a second current source 14 having a current I2, a pre-load value block 16, a counter 18, a logic block 20, an analog switch 22, an integrator 24 which has a capacitor 26, and a comparator 28. The accuracy of integrator 24 is a function of several factors such as the accuracy of capacitor 26, the accuracy of the timing source provided to the dual-slope A/D converter, and the accuracy of a reference value. Dual-slope A/D converter 10 provides the advantage of being inherently noise immune because of the input signal integration it provides.

When the analog switch 22 is connected to current source 12, a current proportional to V1 is applied to the integrator 24 for a fixed period of time t1 and the output wave form 30 of the integrator charges to a voltage equal to $V0+\Delta V$. If V0 is the resulting voltage on the output wave form 30 of the integrator after an auto zero cycle, then errors induced by offset of the comparator 28 and the integrator 24 can be calibrated out, as shown in the equations below. At the end of t1, current I2 proportional to V2 is applied to integrator 24 through switch 22 and then counter 18 is started which counts the number of cycles, measuring time t2, required for the output wave form 30 of the integrator 24 to drop below voltage V0. Referring to FIG. 2, a prior art wave form of output wave form 30 is shown at time t1 and time t2.

Equations of the standard dual-slope A/D converter of FIG. 1 which reflect the prior art wave form of FIG. 2 will now be developed. These equations are based upon the principal that:

---

(1) $I = C * dv/dt$, where I is current, C is the capacitance of capacitor 26 of integrator 24, and dv/dt is the variation of voltage with respect to time.
  It follows from equation 1, that:
(2) $I1 = C * \Delta v1/t1$ and
(3) $I2 = C * \Delta v2/t2$, where t1 is the fixed time, t2 is the measured time, v1 is the unknown analog voltage, and v2 is the reference voltage.
If $\Delta v1 = \Delta v2$, then:
(4) $I1 * t1 = I2 * t2$
and since $I1 = v1/R1$ and $I2 = v2/R2$, and assuming $R1 = R2$, then:
(5) $v1 * t1 = v2 * t2$.
We can define a constant k, since time t1 is a fixed time, that is equal to:
(6) $k = t1/v2$,
which yields:
(7) $t2 = k * v1$

---

While the above implementation of a standard dual-slope converter does serve to convert a raw analog measurement to a corresponding raw digital value, it does not produce a digital value that is offset with respect to a given measurement range. It is desirable to have a digital value after the conversion is complete that contains an offset, so that a digital value of 0 indicates not a value of 0 Ohms, 0 volts, or 0 Amps, but rather the minimum value of a given range of values. In the above example of measuring voltage between 2 volts and 4 volts, for example, it would be desirable to have a converted digital value of 0 which is representative of the bottom of the measurement range or 2 volts. This may be expressed in equation form where the desired conversion value is represented by:

$$k(X_{unknown} - X_{offset})$$

where k is a constant, $X_{unknown}$ is the unknown analog value being measured, and $X_{offset}$ is the offset value.

SUMMARY OF THE INVENTION

It would be advantageous in the art to utilize analog to digital converter technology that measures an analog value and in turn produces a digital value that is automatically offset with respect to a given measurement range.

Therefore, according to the present invention, standard analog to digital converter circuitry may be utilized to measure an unknown analog value and to produce a digital value after conversion that automatically contains an offset value with respect to a given measurement range. The digital value produced according to the present invention is not representative of a raw measurement value but rather is representative of a value with respect to a given measurement range; thus, a digital value of 0 may indicate the minimum value of a given measurement range rather than a value of 0 Ohms, 0 volts, or 0 Amps. This may be expressed in equation form where the desired conversion value is represented by:

$$k(X_{unknown} - X_{offset})$$

where k is a constant, $X_{unknown}$ is the unknown analog value being measured, and $X_{offset}$ is the offset value. $X_{offset}$ the offset value may or may not be equal to a reference value. The automatic offset function of a standard A/D converter is accomplished by the inclusion of an additional fixed time during the measurement period.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The analog to digital (A/D) converter of the present invention offers the advantage of performing an automatic offset during an additional fixed time of the measurement period such that the digital conversion result automatically contains an offset that is indicative of the measured analog value with respect to a given measurement range. The present invention may be used whenever it is desired to measure and then convert an analog value to a digital value with an offset having a given degree of accuracy. Using the present invention, the analog to digital conversion result is represented by the equation:

$$k(X_{unknown} - X_{offset}),$$

where k is a constant, $X_{unknown}$ is the unknown value being measured, and $X_{offset}$ is the offset value which may or may not be equal to a reference value of the A/D converter. Thus a conversion value of 0 may indicate not a value of 0 volts, 0 Ohms, or 0 Amps, but rather the minimum value of a given range of values. If a value between 2 volts and 4 volts is being measured, a converted digital value of 0 may be representative of 2 volts which is the bottom of the measurement range, and not 0 volts. The present invention, by automatically having an offset function, is thus different from the standard implementation of analog to digital converter technology where the conversion result is equal to a raw measured analog value which has been converted to a corresponding raw digital value and thus does not produce a digital value that is offset with respect to a given measurement range.

The automatic offset function of an A/D converter according to the present invention is accomplished by the inclusion of an additional fixed time during the measurement period. During this additional fixed time, the A/D converter is working as usual; however, the count for the additional fixed period of time is effectively subtracted from the result register, automatically taking into account the desired offset from the measured analog value. In this way, the offset is subtracted from the measured value during the conversion and no additional arithmetic function is required. This implementation of a standard A/D converter requires very little additional logic and basically consists of presenting the measurement timer (counter) with an offset value so that the final result contained in the result register is offset from zero by the desired value.

Figure 1:
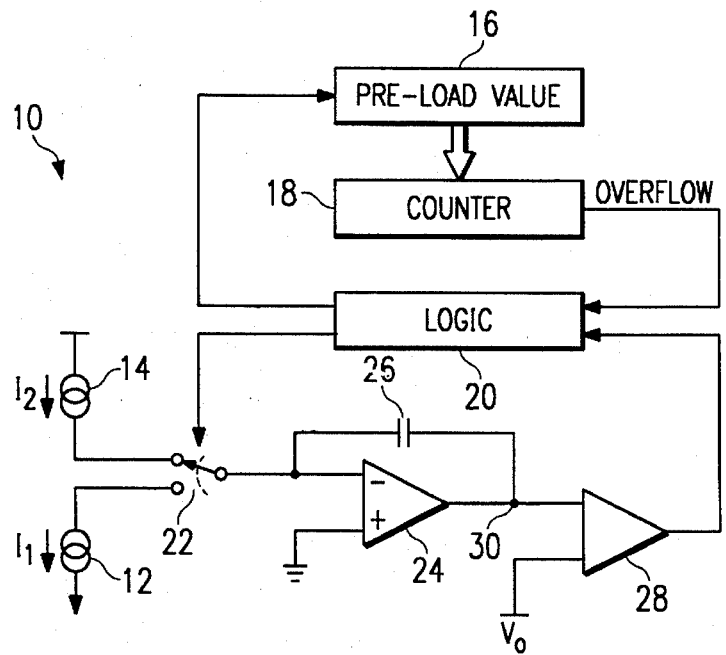
FIG. 1 is a schematic diagram of a standard dual-slope analog to digital (A/D) converter.

There are several possible embodiments of the present invention. The first embodiment is an implementation which utilizes the standard dual-slope A/D converter 10 which is schematically represented in FIG. 1. As described above, dual-slope A/D converter 10 is comprised of a first current source 12 having a current I1, a second current source 14 having a current I2, a pre-load value block 16, a counter 18, a logic block 20, an analog switch 22, an integrator 24 which has a capacitor 26, and a comparator 28. The accuracy of integrator 24 is a function of several factors such as the accuracy of the timing source provided to the dual-slope A/D converter and the accuracy of a reference value. Dual-slope A/D converter 10 provides the advantages of being inherently noise immune because of the input signal integration it provides and of providing high resolution.

For example, using this technique to measure a resistance value, when the analog switch 22 is connected to current source 12, a current proportional to 1/R1 is applied to the integrator 24 for a fixed period of time t1 and the output wave form 30 of the integrator charges to a voltage equal to V0+ΔV. If V0 is the resulting voltage on the output wave form 30 of the integrator after an auto zero cycle, then errors induced by offset of the comparator 28 and the integrator 24 can be calibrated out of the equations for the A/D converter as will be described. Then a current proportional to 1/R2 is applied to the input of the integrator 24 for a fixed period of time t2. At the end of t2, counter 18 is started which counts the number of cycles, measured by time t3, required for the output wave form 30 of the integrator 24 to drop below voltage V0.

Figure 2:
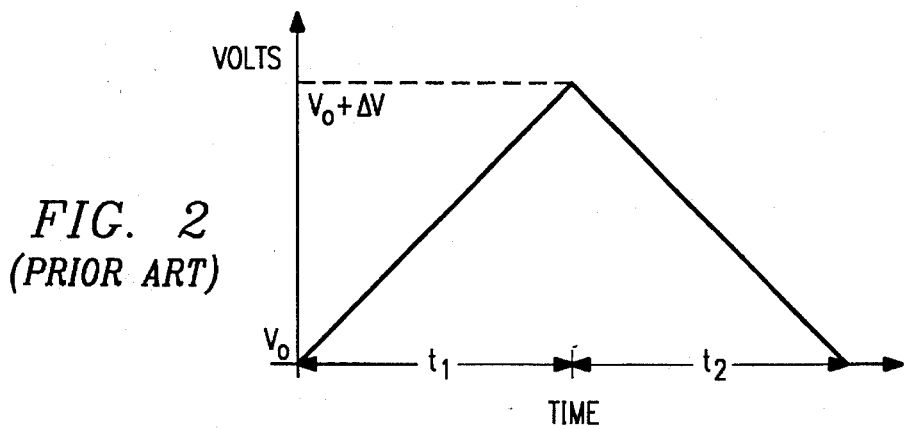
FIG. 2 is a wave form of a standard dual-slope A/D converter, according to the prior art.
Figure 3:
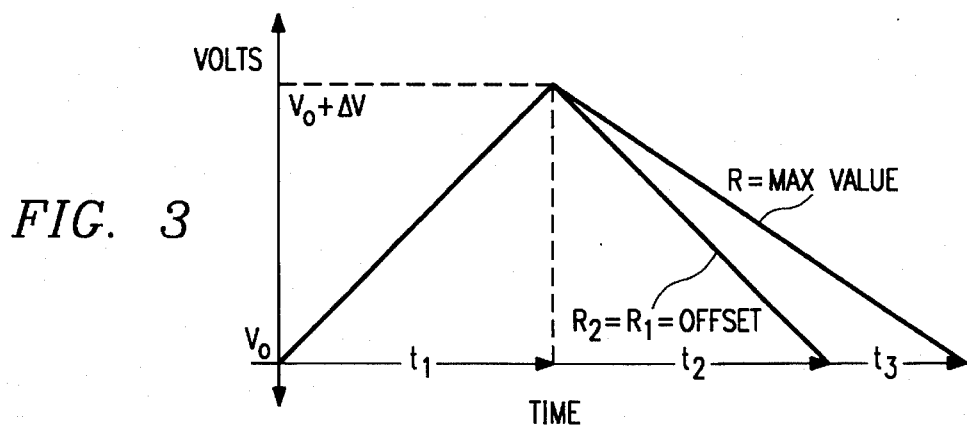
FIG. 3 is a wave form of a standard dual-slope A/D converter, according to a first embodiment of the present invention.

Referring to FIG. 3, a wave form of integrator wave form output 30 of the standard dual-slope A/D converter of FIG. 1, according to the first embodiment of the present invention, is shown. FIG. 3 shows the addition of an additional fixed time t3, over the prior art wave form of FIG. 2, during the conversion that effectively subtracts a value proportional to the offset from the result of the analog to digital conversion. This additional fixed time t2 makes the measurement period equal to t2 plus t3. This extended measurement period during the conversion allows the offset to be automatically considered so that the result in the counter 18 at the end of the conversion is equal to k(R2–R1), where R2 is the unknown resistance that is being measured and R1 encompasses the reference resistance and the offset resistance. As shown in FIG. 3, R2=R1=offset value; at time t3, R2 is at its maximum value. Note that an auto zero technique could also be employed, as described in the Motorola MC14433 data sheet, but this technique is assumed to have been completed before the initial voltage value V0 is established.

A simple implementation of the counter 18 required to control times t1 and t2 and to measure time t3 is a reloadable up-counter. To control time t1, the counter 18 is loaded with a value provided by pre-load value block 16 which is equal to the full scale count less the number of counts required for time t1. The value is equal to the two's complement of offset time t1; for instance, if 100 counts are desired, then counter 18 is loaded with –100, the two's complement of 100. The end of time t1 is indicated when the counter 18 overflows at a value equal to 00H. Then the counter 18 is loaded with a value equal to the full scale count less the number of counts required for time t2 and the current 12 is applied to the integrator 24. The output wave form 30 of the integrator now decreases during the time t2 at a rate that is proportional to the resistance being measured. If the output wave form 30 of the integrator 24 drops below the voltage V0 before the counter 18 has overflowed, indicated when the counter 18 reaches 00H, then the value of the resistance being measured is less than the reference value and an under flow of the A/D converter 10 is recorded. If, however, as expected for a resistance value in the allowable range, the voltage on the output wave form 30 of the integrator 24 has not dropped below V0 by the time the counter 18 overflows or reaches 0H, then the resistance value is within the range and the counter 18 continues to count up. The counter 18 is then stopped when the output of the integrator drops below the voltage V0. At this point the value contained in the counter 18 is the desired measurement. More specifically, it is time t3 which we know to be equal to K(R2–R1). If the voltage on the output wave form 30 of the integrator 24 does not drop below V0 before the counter 18 overflows a second time, then the resistance value is above the allowable range and an overflow condition for the A/D converter 10 is recorded.

Equations, which measure resistance, of the first embodiment of the present invention using the standard dual-slope A/D converter of FIG. 1 and representative of the wave form of FIG. 3 will now be developed. These equations are based upon the principal that:

(8) $I = C * dv/dt$, where I is current, C is the capacitance of capacitor 26 of integrator 24, and dv/dt is representative of the rate of change of voltage.

It follows from equation 8 that:

(9) $I1 = C1 * \Delta v1/t1$ and

(10) $I2 = C2 * \Delta v2/(t2 + t3)$, where t1 is a fixed time, t2 is an additional fixed time, and t3 is a measured time.

If $\Delta v1 = \Delta v2$ and $C1 = C2$, then:

(11) $I1 * t1 = I2 * (t2 = t3)$ and since $I1 = v/R1$ and $I2 = v/R2$, where R1 is the reference resistance and R2 is the unknown resistance, then:

(12) $v * t1/R1 = v * t2/R2 * (t2 + t3)$ and

(13) $R2 * t1 = R1 * (t2 + t3)$

Rewriting equation 13 yields:

(14) $R2 = R1 * t2/t1 + R1 * t3/t1$

If $t2 = t1$, then

(15) $R2 = R1 + R1 * t3/t1$

Rewriting equation 15 defines t3 as:

(16) $t3 = t1 * (R2 - R1)/R1$

Since time t1 is a fixed time, we can define a constant k that is equal to:

(17) $k = t1/R1$, which yields:

(18) $t3 = k * (R2 - R1)$

The above equations demonstrate how to measure an unknown resistance through the use of an additional fixed time t2 during which an offset is automatically subtracted. As an example, suppose it is desired to measure R2 in the range of between 80 Ω and 120 Ω. If R1 is equal to 80 Ω and time t1 and time t2 are both equal to 80 counts, then:

t3=0 counts if R2 is equal to 80Ω, or t3=40 counts if R2 is equal to 120Ω.

It is not required that time t1 be equal to time t2. If time t1 is not equal to t2, then the equation defining t3 is rewritten as follows:

t3=R2* t1/R1–t2        (19)

Suppose, for instance, that now time t1 is equal to 100 counts while time t2 is equal to 80 counts. In this case, when time t3 is equal to 0 counts, then unknown value R2 is equal to 80 Ω, and when time t3 is equal to 100 counts, then R2 is equal to 180Ω.

Equations 8 to 19 above measure resistance for a standard dual-slope A/D converter. Using Ohm's Law, equations which measure voltage may also easily be developed. Starting with the assumption that:

(20)  I1 * t1 = I2 * (t2 + t3) and if
(21)  I1 = v1/R1; I2 = v2/R2; R1 = R2, then
(22)  v1 = v2 * (t2 + t3)/t1.
Assuming that t1 = t2, then
(23)  v1 = v2 + v2 * t3/t1, and
(24)  t3 = (v1 − v2) * (t1/v2)
Since time t1 is fixed and v2 is a reference, it is possible to define a constant equal to:
(25)  k = t1/v2,
such that
(26)  t3 = k * (v1 − v2).

Figure 4:
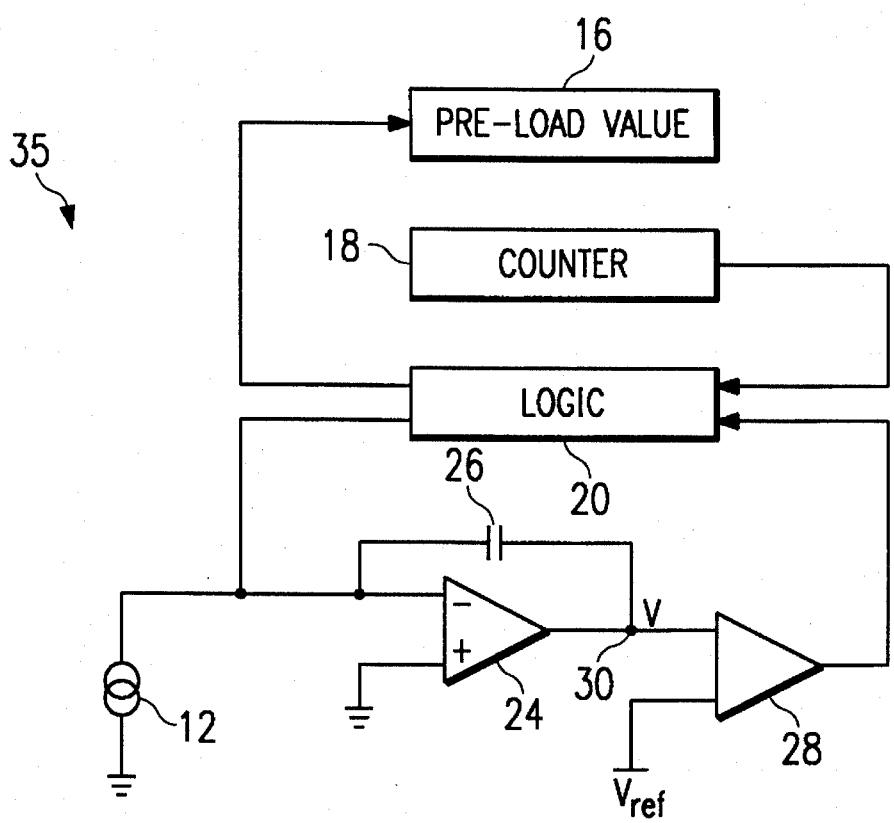
FIG. 4 is a schematic diagram of a single-slope A/D converter.
Figure 5:
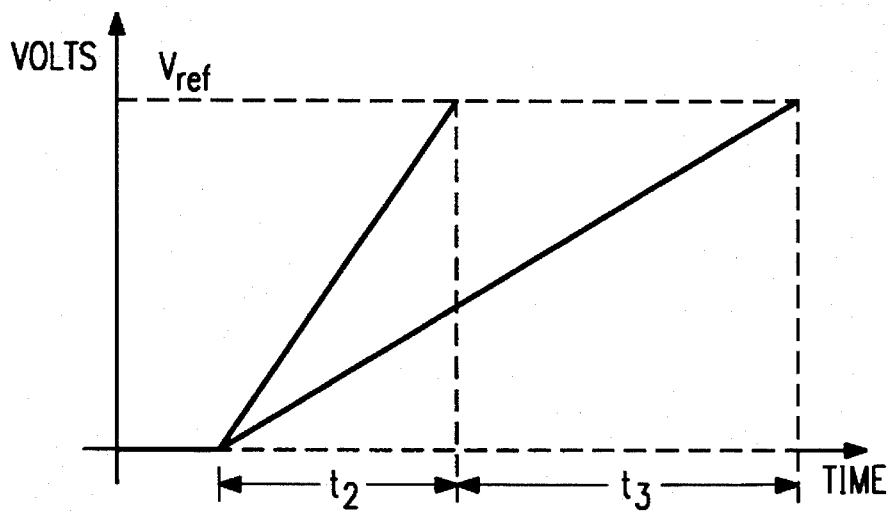
FIG. 5 is a wave form of a single-slope A/D converter, according to a second embodiment of the present invention.

Referring to FIG. 4, a second embodiment of the present invention which is implemented on a single-slope A/D converter 35 is shown. As described above, an additional fixed time is added to the measurement period during which the desired offset is subtracted from the analog to digital conversion result. Single-slope A/D converter 35 is similar to dual-slope A/D converter 10 of FIG. 1 except, of course, that integrator 24 is supplied by a single current source 12 through which current I flows. The single-slope A/D converter 35 provides the advantage of being faster than the dual-slope A/D converter 10 of FIG. 1. The wave form of FIG. 1 illustrates the rise of output wave form 30 of single-slope A/D converter 35 during time t2 and time t3.

The equations for the single-slope A/D converter 35 of FIG. 4 will now be developed. Starting with basic equation that I=v2/R2,

(27)  I = C * dv/dt = C * Δv/Δt and if
(28)  Δv = V2 = Vref and Δt = t2 + t3, then
(29)  I = C * Vref/(t2 + t3) = Vref/R2
Rewriting equation 29 yields:
(30)  R2 = (t2/C) + (t3/C) and
(31)  t3 = (R2 − (t2/C)) * C
Defining a constant k as k = C and setting reference R1 equal to R1 = t2/k yields:
(32)  t3 = k * (R2 − R1)

Figure 6:
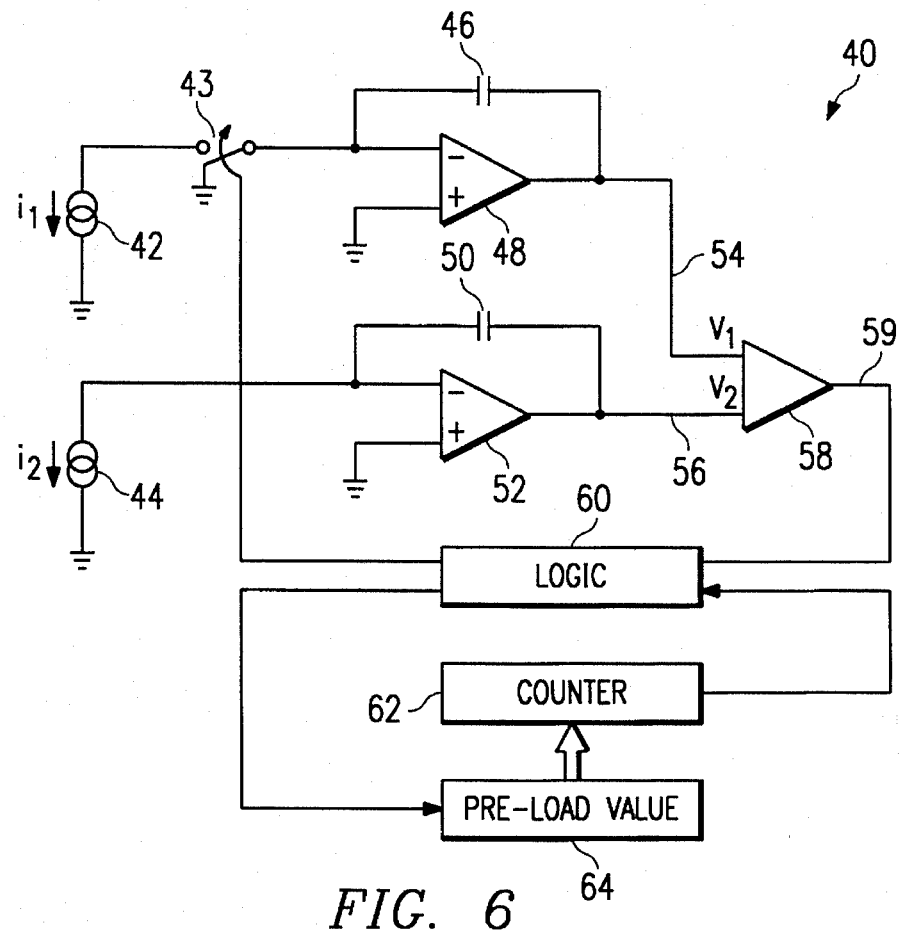
FIG. 6 is a schematic diagram of an A/D converter having two matched integrators.

Referring to FIG. 6, A/D Converter 40, which has two matched integrators 48 and 52, illustrates a third embodiment of the present invention. As with the first and second embodiments of the present invention, an additional fixed time is added to the measurement period during which the desired offset is subtracted from the analog to digital conversion result. A/D Converter 40 is comprised of a first current source 42 having a current I1, an analog switch 43, a second current source 44 having a current I2, a first integrator 48 having a bypass capacitor 46, a second integrator 52 having a bypass capacitor 50, a comparator 58, a logic block 60, a counter 62, and a pre-load value block.

In order to maintain the required precision of A/D Converter 40, the values of capacitors 46 and 50 must be matched to within ±½ of one least significant bit (LSB) of the conversion resolution so that A/D Converter 40 is monotonic. Also, the input offset voltage of the operational amplifier inside each of the integrators 48 and 52 has to be matched exactly to maintain the desired ratio. The offset of the integrators 48 and 52 and comparator 58 could be canceled using an automatic zeroing technique which is well known in the art.

Figure 7:
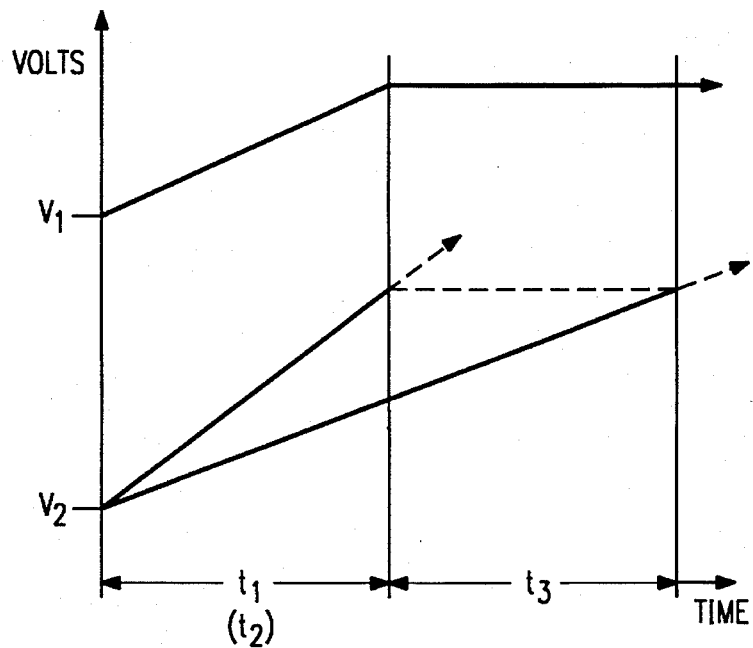
FIG. 7 is a wave form of an A/D converter having two matched integrators, according to a third embodiment of the present invention.

According to this third embodiment of the present invention, the currents I1 and I2 from current sources 42 and 44, respectively, are applied to the inputs of matched integrators 48 and 52 as shown. Single up-counter 62 is loaded with a value which is equal to the full scale value of counter 62 less the number of counts required for period t1; the assumption here is that period t1 is equal to period t2. Both integrators 48 and 52 are allowed to integrate their respective currents I1 and I2 for the period t1. At the end of period t1 when the counter overflows to 00H, current I1 is disconnected from integrator 48 through analog switch 43, and the output wave form 54 is configured to hold the integrated voltage to a constant value. At this point, counter 62 continues to count up until the voltage of the output wave form 56 of integrator 52, fed by current I2, exceeds the voltage of the output wave form 54 of integrator 48. At this point counter 62 is stopped and the value present in counter 62 at this time is equal to the desired measurement of t3 which is equal to K(R2−R1) as described above. This operation of A/D converter 40 is illustrated in the wave form of FIG. 7 where during time t1, the voltage of output wave form 54 is charged to a known value and then the time required to charge the voltage of output wave form 56 to the same known value is measured.

Figure 8:
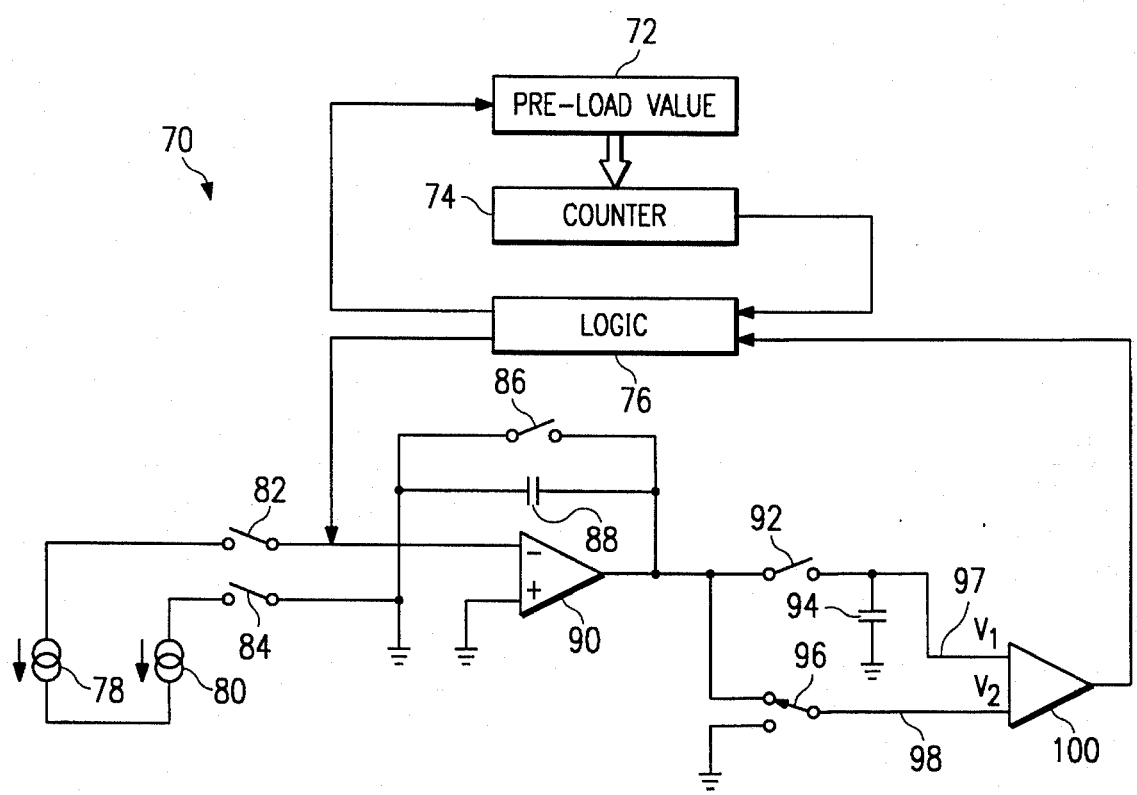
FIG. 8 is a schematic diagram of an A/D converter having a single integrator and sample-and-hold circuitry.

A fourth embodiment of the present invention implemented using an A/D converter having a single integrator and sample-and-hold circuitry is shown in FIG. 8. The A/D converter 70 of FIG. 8 features a single integrator 90 with sample and hold circuitry. The operation of A/D converter 70 is similar to the operation of the dual integrator A/D converter 40 of FIG. 6. A/D converter 70 is comprised of pre-load value block 72, counter 74, logic block 76, a first current source 78, a second current source 80, a first analog switch 82, a second analog switch 84, an integrator 90 having a third analog switch 86 and a bypass capacitor 88 connected in parallel with it and each other, a fourth analog switch 92, a fifth analog switch 96, a sample-and-hold capacitor 94, and a comparator 100.

Figure 9:
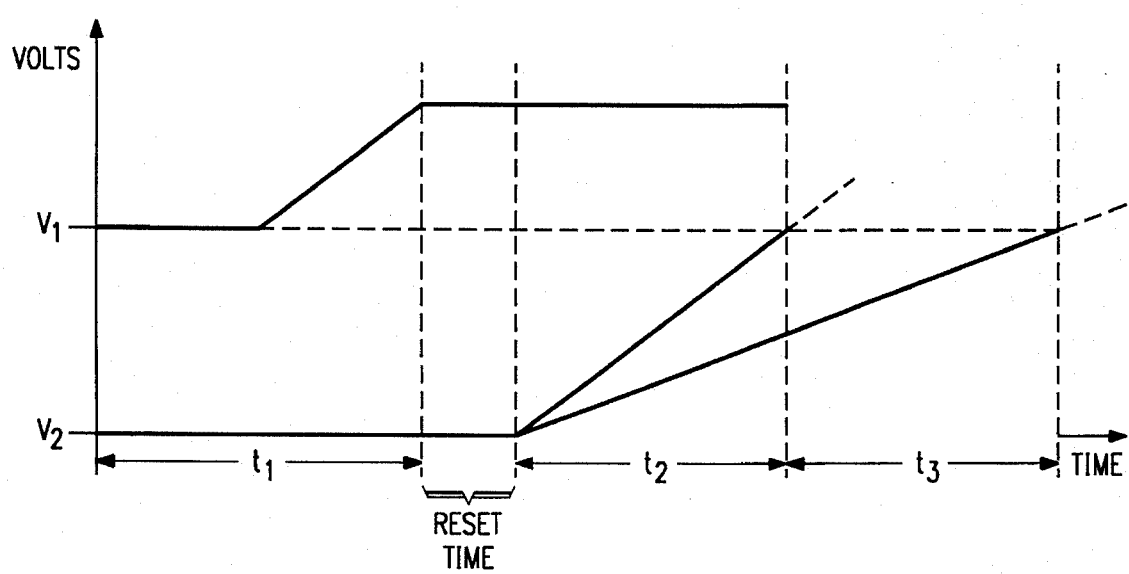
FIG. 9 is a wave form of an A/D converter having a single integrator and sample-and-hold circuitry, according to a fourth embodiment of the present invention.

Referring to FIG. 9, the output wave forms of integrator 90 at v1 97 and v2 98 are shown. After a fixed time t1, wave form v1 97 has risen to a given voltage level and sample-and-hold capacitor 94 operates to keep wave form v1 97 at that voltage level while wave form v2 98 rises to the given voltage level during times t2 and t3 as shown.

Although the foregoing discussion with regard to the present invention discusses measuring resistance, it is clear that the present invention may also be used to measure voltage or current as well, since resistance, current, and voltage are all related by Ohm's law. It should also be clear that, although the above discussion uses equal offset and reference values where t1=t2, implementation of the present invention does not require that the offset value and reference value be equal.

While the invention has been particularly shown and described with reference to a preferred embodiment, it will be understood by those skilled in the art that various changes in form and detail may be made therein without departing from the spirit and scope of the invention.

What is claimed is:

1. A method for converting an analog value to a digital value with an offset having a given degree of accuracy using an analog to digital converter, comprising the steps of:

measuring an analog value;

converting the analog value to a digital value using an analog to digital converter, wherein the analog to digital converter is comprised of the following elements:

a current source having a current;

a counter having a result register;

a logic block;

an integrator which produces a wave form, and which is supplied with the current of the current source during a first fixed period of time and which subtracts the offset value from the digital value to generate a digital conversion result during a second fixed period of time equal to the fixed period of time, wherein the second fixed period of time follows the first fixed period of time;

a comparator which is supplied with the wave form of the integrator and which has an output signal which is presented to the logic block;

wherein during the first fixed period of time, the wave form of the integrator charged to a first voltage level equal to a reference value plus a measured voltage and a count representative of the first fixed period of time is stored in the result register;

wherein during the second fixed period of time, an offset count representative of the offset value and the second fixed period of time is subtracted from the count representative of the first fixed period of time; and wherein during a third period of time which follows the second fixed period of time, a time required for the wave form to reach a second voltage level equal to the reference value is measured; and subtracting an offset value from the digital value to generate a digital conversion result representative of the analog value with respect to a measurement range, having a minimum value and a maximum value, during a fixed period of time of a measurement period.

2. The method of claim 1, wherein the digital conversion result is equal to $k(X_{unknown} - X_{offset})$, where k is a constant, $X_{unknown}$ is the analog value being measured, and $X_{offset}$ is the offset value.

3. The method of claim 1, wherein the offset value is subtracted from the digital value by subtracting a count representative of the fixed period of time from a result register of the analog to digital converter.

4. The method of claim 1, wherein the counter is a reloadable up-counter which controls the first fixed period of time and the second fixed period of time.

5. The method of claim 4, wherein the time required for the wave form to reach the second voltage level is measured by starting the counter after the second fixed period of time and before the third period of time and counting a number of cycles required for the wave form to reach the second voltage level.

6. The method of claim 5, wherein if the wave form drops below the reference value before the counter has overflowed, then the analog value being measured is less than the reference value; and wherein if the wave form does not drop below the reference voltage before the counter has overflowed, then the analog value being measured is within the measurement range and the counter continues to count up until the wave form drops below the reference value.

7. The method of claim 1, wherein before the first fixed period of time, the counter is loaded with a value provided by a pre-load value block.

8. The method of claim 7, wherein the value provided by the pre-load value block is equal to the maximum value of the measurement range less the count representative of the first fixed period of time.

9. The method of claim 8, wherein the value provided by the pre-load value block is equal to a two's complement of the count representative of the first fixed period of time.

10. The method of claim 1, wherein the third period of time is equal to $k(X_{unknown} - X_{offset})$, where k is a constant equal to $t1/X_{offset}$, t1 is the first fixed period of time, $X_{unknown}$ is the analog value being measured, and $X_{offset}$ is the offset value.

11. The method of claim 1, wherein the offset count is equal to a count representative of the reference value.

12. An analog to digital converter which converts an analog value to a digital value with an offset having a given degree of accuracy, comprising:

an analog to digital converter capable of measuring an analog value, converting the analog value to a digital value, and subtracting an offset value from the digital value to generate a digital conversion result representative of the analog value with respect to a measurement range, having a minimum value and a maximum value, during a fixed period of time of a measurement period, the analog to digital converter comprising the following elements:

a current source having a current;

a counter having a result register;

a logic block;

an integrator which produces a wave form, and which is supplied with the current of the current source during a first fixed period of time and which subtracts the offset value from the digital value to generate a digital conversion result during a second fixed period of time equal to the fixed period of time, wherein the second fixed period of time follows the first fixed period of time;

a comparator which is supplied with the wave form of the integrator and which has an output signal which is presented to the logic block;

wherein during the first fixed period of time, the wave form of the integrator charged to a first voltage level equal to a reference value plus a measured voltage and a count representative of the first fixed period of time is stored in the result register;

wherein during the second fixed period of time, an offset count representative of the offset value and the second fixed period of time is subtracted from the count representative of the first fixed period of time; and wherein during a third period of time which follows the second fixed period of time, a time required for the wave form to reach a second voltage level equal to the reference value is measured.

13. The analog to digital converter of claim 12, wherein the digital conversion result is equal to $k(X_{unknown} - X_{offset})$, where k is a constant, $X_{unknown}$ is the analog value being measured, and $X_{offset}$ is the offset value.

14. The analog to digital converter of claim 12, wherein the offset value is subtracted from the digital value by subtracting a count representative of the fixed period of time from the result register of the analog to digital converter.

15. The analog to digital converter of claim 12, wherein the counter is a reloadable up-counter which controls the first fixed period of time and the second fixed period of time.

16. The analog to digital converter of claim 15, wherein the time required for the wave form to reach the second voltage level is measured by starting the counter after the second fixed period of time and before the third period of time and counting a number of cycles required for the wave form to reach the second voltage level.

17. The analog to digital converter of claim 16, wherein if the wave form drops below the reference value before the counter has overflowed, then the analog value being measured is less than the reference value; and wherein if the wave form does not drop below the reference voltage before the counter has overflowed, then the analog value being measured is within the measurement range and the counter continues to count up until the wave form drops below the reference value.

18. The analog to digital converter of claim 12, wherein before the first fixed period of time, the counter is loaded with a value provided by a pre-load value block.

19. The analog to digital converter of claim 18, wherein the value provided by the pre-load value block is equal to the maximum value of the measurement range less the count representative of the first fixed period of time.

20. The analog to digital converter of claim 19, wherein the value provided by the pre-load value block is equal to a two's complement of the count representative of the first fixed period of time.

21. The analog to digital converter of claim 12, wherein the third period of time is equal to $k(X_{unknown} - X_{offset})$, where k is a constant equal to $t1/X_{offset}$, t1 is the first fixed period of time, $X_{unknown}$ is the analog value being measured, and $X_{offset}$ is the offset value.

22. The analog to digital converter of claim 12, wherein the offset count is equal to a count representative of the reference value.

* * * * *